US010116336B2

(12) United States Patent
Hu et al.

(10) Patent No.: US 10,116,336 B2
(45) Date of Patent: Oct. 30, 2018

(54) ERROR CORRECTING CODE ADJUSTMENT FOR A DATA STORAGE DEVICE

(71) Applicant: SANDISK TECHNOLOGIES LLC, Plano, TX (US)

(72) Inventors: Xinde Hu, San Diego, CA (US); Manuel Antonio D'Abreu, El Dorado Hills, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 14/304,277

(22) Filed: Jun. 13, 2014

(65) Prior Publication Data

US 2015/0363262 A1 Dec. 17, 2015

(51) Int. Cl.
*H03M 13/35* (2006.01)
*H03M 13/37* (2006.01)
*G06F 11/10* (2006.01)

(52) U.S. Cl.
CPC ....... *H03M 13/353* (2013.01); *G06F 11/1048* (2013.01); *H03M 13/3738* (2013.01)

(58) Field of Classification Search
CPC .................. H03M 13/353; H03M 13/3738
USPC ......................................... 714/774, 708, 773
See application file for complete search history.

(56) References Cited

U.S. PATENT DOCUMENTS

| | | | | |
|---|---|---|---|---|
| 4,562,578 A * | 12/1985 | Odaka et al. | ................. | 714/753 |
| 4,701,923 A * | 10/1987 | Fukasawa et al. | ............. | 714/774 |
| 4,903,268 A * | 2/1990 | Hidaka | ............... | G06F 11/1008 |
| | | | | 714/718 |
| 4,954,944 A * | 9/1990 | Ikeda | .................. | G06F 12/1054 |
| | | | | 711/202 |
| 4,958,352 A * | 9/1990 | Noguchi | ............... | G06F 11/076 |
| | | | | 714/704 |
| 5,289,477 A * | 2/1994 | Lenta | .................. | G06F 11/1012 |
| | | | | 711/E12.089 |
| 5,379,162 A * | 1/1995 | Cunningham et al. | ......... | 360/53 |
| 5,453,997 A * | 9/1995 | Roney, IV | ..................... | 714/774 |
| 5,699,365 A * | 12/1997 | Klayman | .............. | H03M 13/35 |
| | | | | 714/708 |
| 5,956,743 A * | 9/1999 | Bruce et al. | ................... | 711/103 |
| 6,041,001 A | 3/2000 | Estakhri | | |
| 6,108,229 A * | 8/2000 | Shau | ..................... | G11C 7/1006 |
| | | | | 257/E27.092 |
| 6,182,264 B1 * | 1/2001 | Ott | ................................ | 714/774 |
| 6,239,931 B1 * | 5/2001 | Chung | ............... | G11B 20/1883 |
| | | | | 360/53 |
| 6,625,777 B1 * | 9/2003 | Levin et al. | ................... | 714/774 |
| 6,704,230 B1 | 3/2004 | DeBrosse et al. | | |
| 6,851,081 B2 * | 2/2005 | Yamamoto | .......... | G06F 11/1008 |
| | | | | 714/6.2 |

(Continued)

*Primary Examiner* — Joseph D Torres
(74) *Attorney, Agent, or Firm* — Michael Best & Friedrich LLP

(57) ABSTRACT

A data storage device includes a non-volatile memory and a controller operationally coupled to the non-volatile memory. The controller is configured to access information stored at the non-volatile memory. The information includes a user data portion and an error correcting code (ECC) portion corresponding to the user data portion. The controller is further configured to modify the ECC portion in response to an error rate associated with the information exceeding a threshold. The one or more ECC parameters are modified without erasing or re-programming the user data portion.

14 Claims, 9 Drawing Sheets

(56) References Cited

U.S. PATENT DOCUMENTS

| | | | |
|---|---|---|---|
| 6,957,379 B1* | 10/2005 | Patapoutian et al. | 714/774 |
| 7,162,660 B2* | 1/2007 | Ogino | 714/6.13 |
| 7,210,077 B2* | 4/2007 | Brandenberger et al. | 714/708 |
| 7,330,370 B2* | 2/2008 | Rinerson | G11C 11/16 |
| | | | 365/158 |
| 7,428,669 B2* | 9/2008 | Cioffi | 714/704 |
| 7,763,496 B2* | 7/2010 | Ikeda | H01L 25/0657 |
| | | | 438/109 |
| 7,810,017 B2* | 10/2010 | Radke | H03M 13/05 |
| | | | 714/758 |
| 8,006,166 B2* | 8/2011 | Roohparvar et al. | 714/768 |
| 8,122,323 B2* | 2/2012 | Leung et al. | 714/774 |
| 8,266,482 B2* | 9/2012 | Tune et al. | 714/712 |
| 8,341,498 B2 | 12/2012 | D'Abreu et al. | |
| 8,429,492 B2* | 4/2013 | Yoon et al. | 714/763 |
| 8,458,568 B2* | 6/2013 | Cideciyan et al. | 714/774 |
| 8,539,313 B2 | 9/2013 | D'Abreu et al. | |
| 8,615,700 B2* | 12/2013 | Dave et al. | 714/773 |
| 8,700,951 B1 | 4/2014 | Call et al. | |
| 8,751,906 B2* | 6/2014 | Yeo et al. | 714/774 |
| 8,862,967 B2* | 10/2014 | Pancholi et al. | 714/779 |
| 8,898,548 B1* | 11/2014 | Mullendore et al. | 714/774 |
| 8,898,549 B2* | 11/2014 | Hubris et al. | 714/774 |
| 8,935,594 B2* | 1/2015 | Chen | G06F 11/1048 |
| | | | 714/766 |
| 9,092,353 B1* | 7/2015 | Micheloni | G06F 11/1008 |
| 9,263,138 B1* | 2/2016 | Wilson | G11C 16/10 |
| 2001/0003513 A1* | 6/2001 | Shau | G11C 7/1006 |
| | | | 365/222 |
| 2002/0150167 A1* | 10/2002 | Demjanenko et al. | 375/259 |
| 2003/0005385 A1* | 1/2003 | Stieger | 714/758 |
| 2003/0023809 A1* | 1/2003 | Oldfield et al. | 711/114 |
| 2004/0153949 A1* | 8/2004 | Ro | G11B 20/18 |
| | | | 714/774 |
| 2008/0072120 A1* | 3/2008 | Radke | G06F 11/1068 |
| | | | 714/768 |
| 2008/0270878 A1* | 10/2008 | He et al. | 714/805 |
| 2009/0241008 A1* | 9/2009 | Kim et al. | 714/755 |
| 2009/0319838 A1* | 12/2009 | Jones, Jr. | 714/704 |
| 2010/0211725 A1* | 8/2010 | Nagashima et al. | 711/103 |
| 2010/0241928 A1* | 9/2010 | Kim | G06F 11/1012 |
| | | | 714/763 |
| 2011/0131473 A1 | 6/2011 | Mokhlesi et al. | |
| 2011/0191654 A1* | 8/2011 | Rub | H03M 13/05 |
| | | | 714/773 |
| 2011/0214034 A1* | 9/2011 | Otsuka | G06F 11/1072 |
| | | | 714/758 |
| 2012/0185753 A1* | 7/2012 | Chen | G06F 11/1048 |
| | | | 714/773 |
| 2013/0094288 A1* | 4/2013 | Patapoutian | G11C 16/06 |
| | | | 365/185.03 |
| 2013/0124945 A1* | 5/2013 | Hu et al. | 714/773 |
| 2013/0246878 A1 | 9/2013 | Pancholi et al. | |
| 2014/0068319 A1* | 3/2014 | Daly | 714/6.2 |
| 2014/0136927 A1 | 5/2014 | Li et al. | |
| 2014/0149826 A1 | 5/2014 | Lu et al. | |
| 2014/0229655 A1* | 8/2014 | Goss | G06F 12/0246 |
| | | | 711/103 |
| 2014/0229799 A1* | 8/2014 | Hubris | H04L 1/0009 |
| | | | 714/773 |

* cited by examiner

ERROR CORRECTING CODE ADJUSTMENT FOR A DATA STORAGE DEVICE

FIELD OF THE DISCLOSURE

The present disclosure is generally related to error correction for data storage devices.

BACKGROUND

Non-volatile data storage devices have enabled increased portability of data and software applications. For example, multi-level cell (MLC) storage elements of a flash memory device may each store multiple bits of data, enhancing data storage density as compared to single-level cell (SLC) flash memory devices. Consequently, memory devices enable users to store and access a large amount of data.

As a number of bits stored per cell increases, errors in stored data typically increase (e.g., due to noise and other factors). A data storage device may encode and decode data using an error correcting code (ECC) technique. The ECC technique may enable error correction. For example, data may be stored with ECC information (e.g., parity bits) to enable correction of errors that may be present in the data. As a data storage device is repeatedly programmed over the operating cycle of the data storage device, an error rate may increase at the data storage device. For example, an error rate may exceed an error correction capability associated with the particular ECC scheme due to physical wear to a memory device caused by program/erase cycles, which may result in data loss.

SUMMARY

A data storage device includes a memory and a controller. Prior to storing user data at the memory, the controller may encode the user data to generate ECC information corresponding to the user data. For example, the user data may be encoded using a first ECC scheme and a first code rate (e.g., using a particular number of ECC bits). The user data and the ECC information may be stored to the memory (e.g., as an ECC codeword).

During operation of the data storage device, if the controller detects that an error rate associated with the ECC codeword satisfies a threshold, the controller may overwrite the ECC information with updated ECC information that is generated using a second ECC scheme different than the first ECC scheme and/or using a second code rate different than the first code rate. In a particular embodiment, the memory includes a resistive random access memory (ReRAM), and the controller overwrites the ECC information using a partial-write in-place command that overwrites the ECC information without erasing or re-programming the user data. Accordingly, ECC parameters at the data storage device can be adjusted during the operating cycle of the data storage device (e.g., as the ReRAM undergoes physical wear) while enabling reduced program/erase cycles (e.g., by avoiding erasing or modifying the user data).

DETAILED DESCRIPTION

Figure 1:
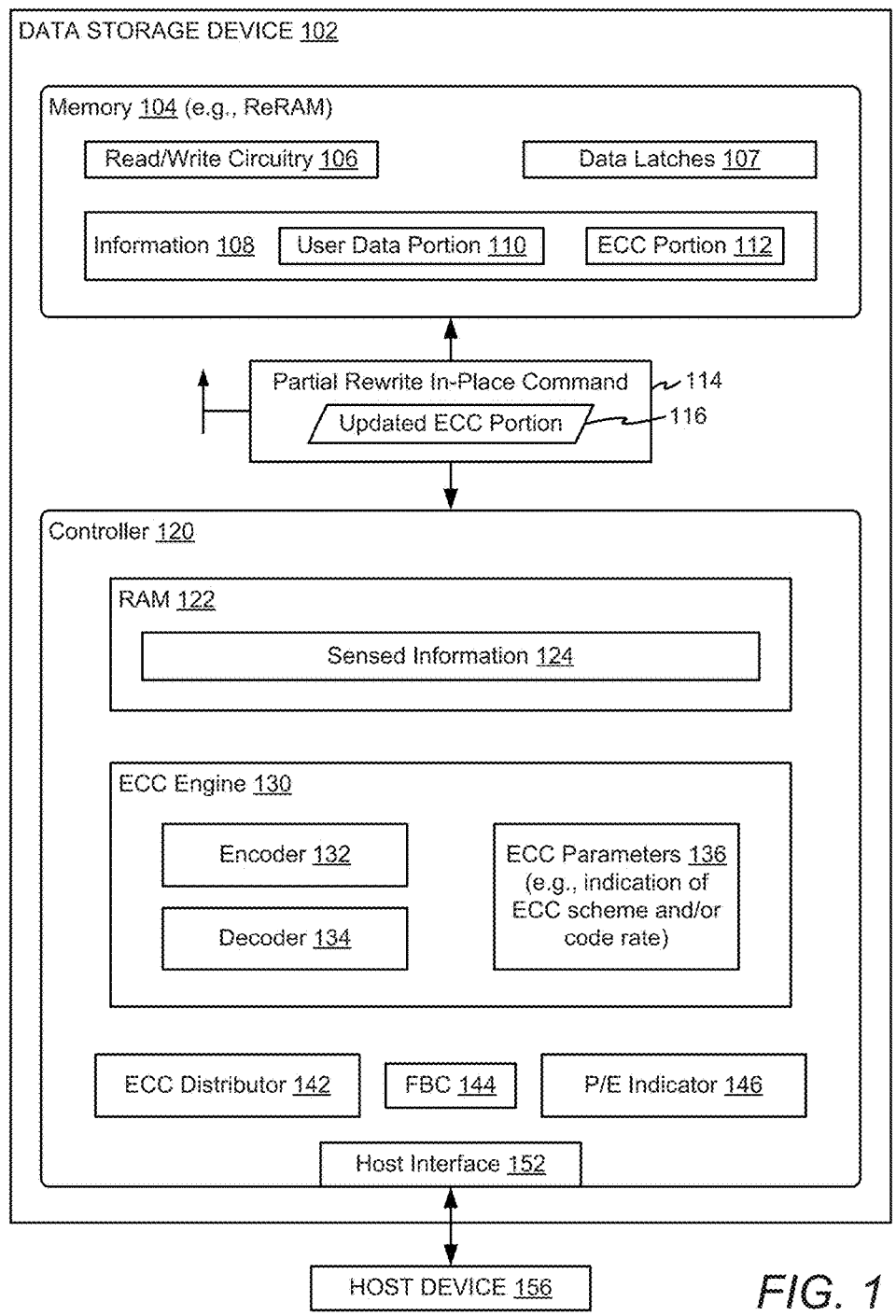
FIG. 1 is a block diagram of a particular illustrative embodiment of a system including a data storage device that includes a memory and a controller that is configured to send a partial-write in-place command to the memory.

Referring to FIG. 1, a particular illustrative embodiment of a system is depicted and generally designated 100. The system 100 includes a data storage device 102 and a host device 156. The data storage device 102 and the host device 156 may be operationally coupled via a connection, such as a bus or a wireless connection. The data storage device 102 may be embedded within the host device 156, such as in accordance with a Joint Electron Devices Engineering Council (JEDEC) Solid State Technology Association Universal Flash Storage (UFS) configuration. Alternatively, the data storage device 102 may be removable from the host device 156 (i.e., "removably" coupled to the host device 156). As an example, the data storage device 102 may be removably coupled to the host device 156 in accordance with a removable universal serial bus (USB) configuration.

The data storage device 102 may include a memory 104 and a controller 120 that is operationally coupled to the memory 104. The memory 104 may include a non-volatile memory, such as a resistive random access memory (Re-RAM). The memory 104 may include read/write circuitry 106 and data latches 107.

The memory 104 may have a three-dimensional (3D) memory configuration. Alternatively, the memory 104 may have another configuration, such as a two-dimensional (2D) memory configuration. In a particular implementation, the memory 104 is a ReRAM having a three-dimensional (3D) memory configuration that is monolithically formed in one or more physical levels of arrays of memory cells having an active area disposed above a silicon substrate.

The controller 120 may include a random access memory (RAM) 122, an error correcting code (ECC) engine 130, and an ECC distributor 142. The controller 120 may be configured to store an error indication, such as a failure count (FBC) 144, and a program/erase (P/E) indicator 146. The controller 120 may further include a host interface 152.

The ECC engine 130 may include one or more encoders, such as an encoder 132. The encoder 132 is configured to receive data and to generate one or more ECC codewords based on the data. The encoder 132 may include a Hamming encoder, a Reed-Solomon (RS) encoder, a Bose-Chaudhuri- Hocquenghem (BCH) encoder, a low-density parity check (LDPC) encoder, a turbo encoder, an encoder configured to encode data according to one or more other ECC schemes, or a combination thereof.

The ECC engine 130 may further include one or more decoders, such as a decoder 134. The decoder 134 is configured to decode data accessed from the memory 104. For example, the decoder 134 may be configured to decode data accessed from the memory 104 to detect and correct one or more errors that may be present in the data, up to an error correcting capacity of the particular ECC scheme. The decoder 134 may include a Hamming decoder, an RS decoder, a BCH decoder, an LDPC decoder, a turbo decoder, a decoder configured to decode data according to one or more other ECC schemes, or a combination thereof.

The ECC distributor 142 may be configured to statistically determine (e.g., "distribute") positions of ECC information relative to corresponding user data within ECC codewords. For example, the ECC distributor 142 may be configured to insert ECC information at the beginning of an ECC codeword with a probability of one-third, at the middle of an ECC codeword with a probability of one-third, and at the end of the ECC codeword with a probability of one third. Alternatively, the ECC distributor 142 may operate in accordance with one or more other schemes (e.g., by weighting different positions with ECC codewords using different probabilities, as an illustrative example).

The controller 120 is configured to receive data and instructions from the host device 156 and to send data to the host device 156. For example, the controller 120 may send data to the host device 156 via the host interface 152 and may receive data from the host device 156 via the host interface 152.

The controller 120 is configured to send data and commands to the memory 104 and to receive data from the memory 104. For example, the controller 120 is configured to send data and a write command to cause the memory 104 to store the data to a specified address of the memory 104. The write command may specify a physical address of a portion of the memory 104 (e.g., a physical address of a word line of the memory 104) that is to store the data. The controller 120 is configured to send a read command to the memory 104 to access data from a specified address of the memory 104. The read command may specify the physical address of a portion of the memory 104 (e.g., a physical address of a word line of the memory 104).

The host device 156 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 156 may communicate via a host controller, which may enable the host device 156 to communicate with the data storage device 102. The host device 156 may operate in compliance with a JEDEC Solid State Technology Association industry specification, such as an embedded MultiMedia Card (eMMC) specification or a Universal Flash Storage (UFS) Host Controller Interface specification. The host device 156 may operate in compliance with one or more other specifications, such as a Secure Digital (SD) Host Controller specification as an illustrative example. Alternatively, the host device 156 may communicate with the data storage device 102 in accordance with another communication protocol.

In operation, the controller 120 may receive user data (e.g., host data) and a request for write access to the memory 104 from the host device 156 via the host interface 152. The controller 120 may input the user data to the encoder 132 to generate one or more ECC codewords. For example, the encoder 132 may encode the user data using a BCH encoding technique or using an LDPC encoding technique to generate one or more ECC codewords.

The controller 120 may store the one or more ECC codewords to the memory 104. For example, the controller 120 may store information 108 to the memory 104, and the information 108 may correspond to an ECC codeword generated by the encoder 132. The information 108 may include a user data portion 110 and an ECC portion 112. To further illustrate, the ECC portion 112 may include redundancy information generated by the encoder 132 based on the user data portion 110 using a BCH technique or using an LDPC technique, as illustrative examples.

The controller 120 may receive a request for read access to the information 108 from the host device 156 via the host interface 152. In response to receiving the request for read access, the controller 120 may cause the read/write circuitry 106 to sense the information 108. For example, the controller 120 may send one or more control signals to the read/write circuitry 106. The one or more control signals may indicate a physical address associated with the information 108 and/or one or more techniques for accessing the information 108 (e.g., a "hard" read technique and/or a "soft" read technique).

The read/write circuitry 106 may provide the sensed data to the controller 120, such as using the data latches 107. For example, the read/write circuitry 106 may provide sensed information 124 to the controller 120, and the sensed information 124 may correspond to the information 108. It is noted that the sensed information 124 may include one or more errors, such as write errors caused during writing of the information 108 to the memory 104, errors caused during storage of the information 108 (e.g., due to noise, cross coupling effects, charge leakage, etc.), and/or read errors caused during sensing of the information 108.

The controller 120 may input the sensed information 124 to the decoder 134 to initiate a decoding process to correct one or more errors of the sensed information 124. For example, the decoder 134 may use the bits of the ECC portion 112 to correct one or more bits of the user data portion 110, such as in accordance with a BCH decoding technique. After decoding the sensed information 124, the controller 120 may send data corresponding to the user data portion 110 to the host device 156.

During the decoding process, the decoder 134 may determine an error rate associated with the sensed information 124, such as by counting errors detected in the sensed information 124. The FBC 144 may be updated to indicate the error rate (e.g., the FBC 144 may be updated by the controller 120 to "track" an error rate of one or more sets of information, such as the information 108). The FBC 144 may be associated with a particular block of information (e.g., an ECC codeword), and the FBC 144 may be updated to indicate an error rate (or a number or errors) based on each decoding operation performed using the particular block of information. The controller 120 may be configured to maintain multiple FBCs for multiple blocks of information stored at the memory 104. In another example, the FBC 144 may be associated with multiple blocks of information stored at the memory 104 (e.g., the FBC 144 may indicate a "global" error rate associated with all information stored at the memory 104).

The controller 120 may be configured to modify one or more ECC parameters 136 in response to the error rate exceeding a threshold. The one or more ECC parameters 136 may correspond to an ECC scheme used to generate the ECC portion 112, a code rate associated with the information 108 (e.g., a parity size of the ECC portion 112, such as a number of bits of the ECC portion 112), or a combination thereof. The controller 120 may update the one or more ECC parameters 136, such as by modifying the ECC scheme from a BCH scheme to an LDPC scheme and/or by decreasing the code rate.

After modifying the one or more ECC parameters 136, the controller 120 may generate an updated ECC portion 116 associated with the user data portion 110 (e.g., based on the modified ECC scheme and/or based on the decreased code rate). The controller 120 may send a partial rewrite in-place command 114 to the memory 104. The partial rewrite in-place command 114 may cause the memory 104 to modify (e.g., overwrite) the ECC portion 112 using the updated ECC portion 116. In a particular embodiment, the partial rewrite in-place command 114 does not include user data (e.g., does not include the user data portion 110). In a particular implementation, the partial rewrite in-place command 114 causes the memory 104 to modify the ECC portion 112 without erasing the user data portion 110 and without modifying the user data portion 110. For example, in an illustrative ReRAM configuration, the memory 104 may support "partial" writes that enable modification of ECC information without modifying corresponding user data (e.g., as compared to a flash memory configuration in which entire ECC codewords are rewritten).

The example of FIG. 1 illustrates that one or more ECC parameters may be modified based on an error rate associated with information. For example, the ECC portion 112 may be overwritten with the updated ECC portion 116 using the partial rewrite in-place command 114 in response to an error rate associated with the information 108 exceeding a threshold. Accordingly, rewriting all of the information 108 may be avoided, which may reduce a number of program/erase (P/E) cycles at the memory 104, thus reducing physical wear on the memory 104. Additional examples of modification of ECC parameters are described further with reference to FIGS. 2-4.

Figure 2:
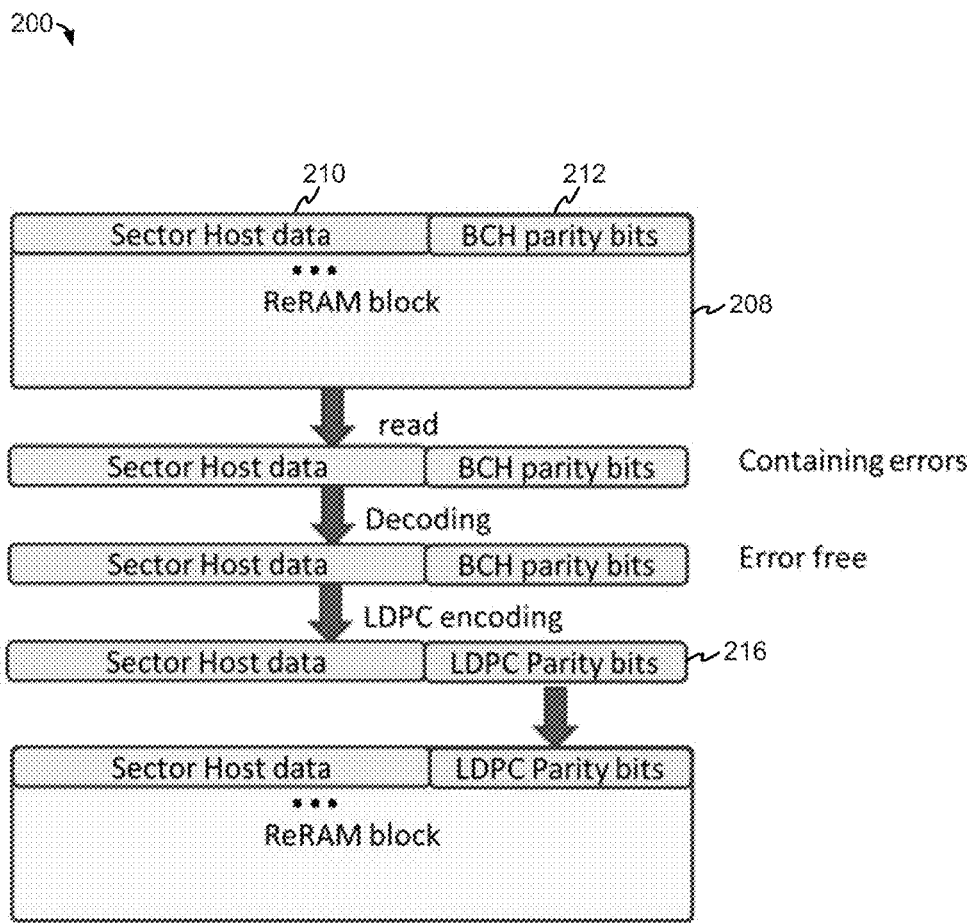
FIG. 2 is a data flow diagram of an example process for adjusting one or more ECC parameters associated with information stored at the data storage device of FIG. 1.

FIG. 2 is a data flow diagram illustrating a process 200 that may be performed at the data storage device 102 of FIG. 1. In the process 200, sector host data 210 and BCH parity bits 212 are included in a ReRAM block 208. The ReRAM block 208 may correspond to a "chunk" or block of information, such as the information 108. For example, the ReRAM block 208 may correspond to a user file, such as an image file, a video file, an audio file, etc. (or a portion thereof). The ReRAM block 208 may include one or more ECC codewords generated by the encoder 132. The sector host data 210 may correspond to the user data portion 110, and the BCH parity bits 212 may correspond to the ECC portion 112.

The controller 120 of FIG. 1 may initiate a read operation to read the sector host data 210. For example, the controller 120 may receive a request for read access to the sector host data 210 from the host device 156, and the controller 120 may initiate the read operation in response to receiving the request for read access.

The controller 120 may input the sector host data 210 and the BCH parity bits 212 to the decoder 134. The decoder 134 may initiate a decoding process to decode the sector host data 210 using the BCH parity bits 212. If an error rate of the sector host data 210 exceeds an error threshold, the decoder 134 may adjust one or more ECC parameters associated with the sector host data 210. For example, the decoder 134 may change an ECC scheme used to encode the sector host data 210. The decoder 134 may generate updated ECC information, such as LDPC parity bits 216, based on the sector host data 210. The error rate may be indicated by the FBC 144, the LDPC parity bits 216 may correspond to the updated ECC portion 116, and the one or more ECC parameters may correspond to the one or more ECC parameters 136 of FIG. 1.

After generating the LDPC parity bits 216, the controller 120 may overwrite the BCH parity bits 212 with the LDPC parity bits 216. For example, the controller 120 may send the partial rewrite in-place command 114 to the memory 104 with the LDPC parity bits 216 to cause the memory 104 to overwrite the BCH parity bits 212 with the LDPC parity bits 216. Overwriting the BCH parity bits 212 with the LDPC parity bits 216 may be performed without erasing or rewriting the sector host data 210.

The example of FIG. 2 illustrates that ECC information may be updated and overwritten without erasing or rewriting corresponding user data. For example, the BCH parity bits 212 may be updated with the LDPC parity bits 216 without erasing or rewriting the sector host data 210. Thus, a number of storage elements programmed and erased at the memory 104 may be reduced as compared to reprogramming an entire "chunk" of information (e.g., the ReRAM block 208), thus reducing an overall number of P/E cycles at the memory 104, which may extend an operating life of the memory 104.

Figure 3:
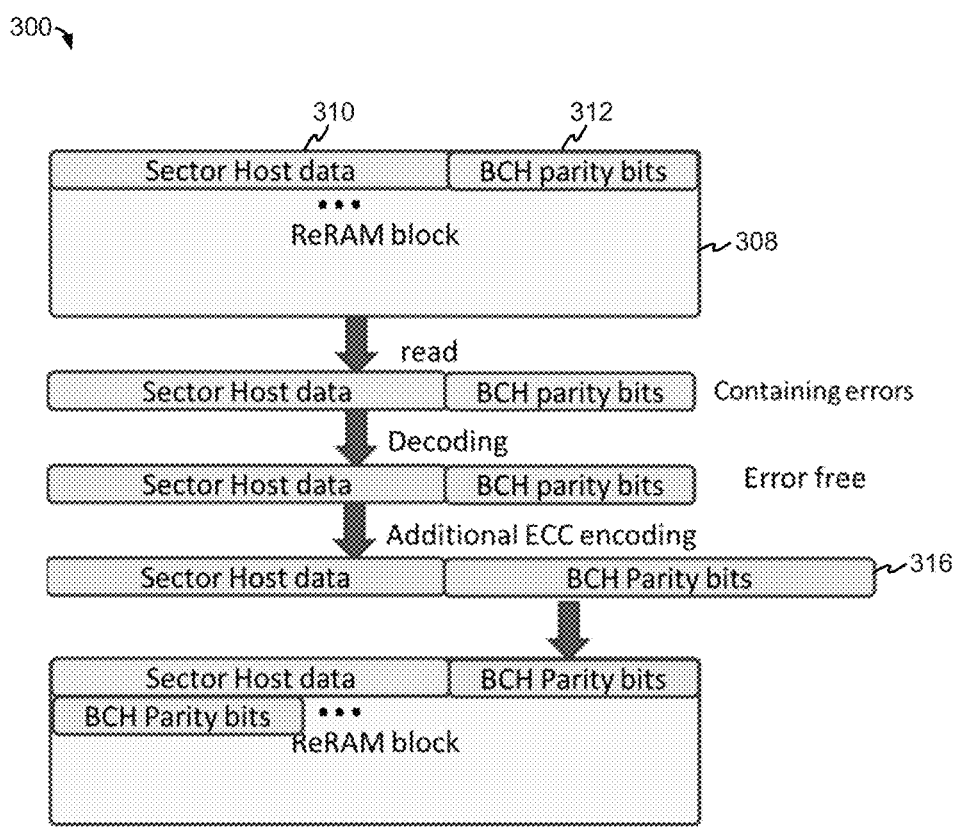
FIG. 3 is a data flow diagram of another example process for adjusting one or more ECC parameters associated with information stored at the data storage device of FIG. 1.

FIG. 3 is a data flow diagram illustrating a process 300 that may be performed at the data storage device 102 of FIG. 1. In the process 300, sector host data 310 and BCH parity bits 312 are included in a ReRAM block 308. The ReRAM block 308 may correspond to a "chunk" or block of information, such as the information 108. For example, the ReRAM block 308 may correspond to a user file, such as an image file, a video file, an audio file, etc. (or a portion thereof). The ReRAM block 308 may include one or more ECC codewords generated by the encoder 132. The sector host data 310 may correspond to the user data portion 110, and the BCH parity bits 312 may correspond to the ECC portion 112.

The controller 120 of FIG. 1 may initiate a read operation to read the sector host data 310. For example, the controller 120 may receive a request for read access to the sector host data 310 from the host device 156, and the controller 120 may initiate the read operation in response to receiving the request for read access.

The controller 120 may input the sector host data 310 and the BCH parity bits 312 to the decoder 134. The decoder 134 may initiate a decoding process to decode the sector host data 310 using the BCH parity bits 312. If an error rate of the sector host data 310 exceeds an error threshold, the decoder 134 may adjust one or more ECC parameters associated with the sector host data 310. For example, the decoder 134 may decrease a code rate used to encode the sector host data 310. The decoder 134 may generate updated ECC information, such as BCH parity bits 316, based on the sector host data 310. The error rate may be indicated by the FBC 144, the BCH parity bits 316 may correspond to the updated ECC portion 116, and the one or more ECC parameters may correspond to the one or more ECC parameters 136 of FIG. 1.

After generating the BCH parity bits 316, the controller 120 may modify the BCH parity bits 312 with the BCH parity bits 316. For example, the controller 120 may send the partial rewrite in-place command 114 to the memory 104 with the BCH parity bits 316 to cause the memory 104 to overwrite the BCH parity bits 312 with the BCH parity bits 316. Overwriting the BCH parity bits 312 with the BCH parity bits 316 may be performed without erasing or rewriting the sector host data 310. As another example, the controller 120 may "extend" the BCH parity bits 312 by adding one or more bits to the BCH parity bits 312 to generate the BCH parity bits 316. In this case, an ECC portion (e.g., the BCH parity bits 312) may be modified by "extending" the ECC portion with one or more bits, such as by adding the one or more bits to the BCH parity bits 312 to generate the BCH parity bits 316. In this example, the one or more bits can be written to the memory 104 at a different location than a location of the ECC portion. For example, in a NAND flash implementation, the one or more bits can be written to a different word line (or erase group) than a word line (or erase group) that stores the sector host data 310 and/or the BCH parity bits 312. As another example, in a ReRAM implementation, the one or more bits may be stored at a separate block of information that may be reserved for such "extended" ECC information.

The example of FIG. 3 illustrates that ECC information may be updated and overwritten without erasing or rewriting corresponding user data. For example, the BCH parity bits 312 may be updated with the BCH parity bits 316 without erasing or rewriting the sector host data 310. Thus, a number of storage elements programmed and erased at the memory 104 may be reduced as compared to reprogramming an entire "chunk" of information (e.g., the ReRAM block 308), thus reducing an overall number of P/E cycles at the memory 104, which may extend an operating life of the memory 104.

Figure 4:
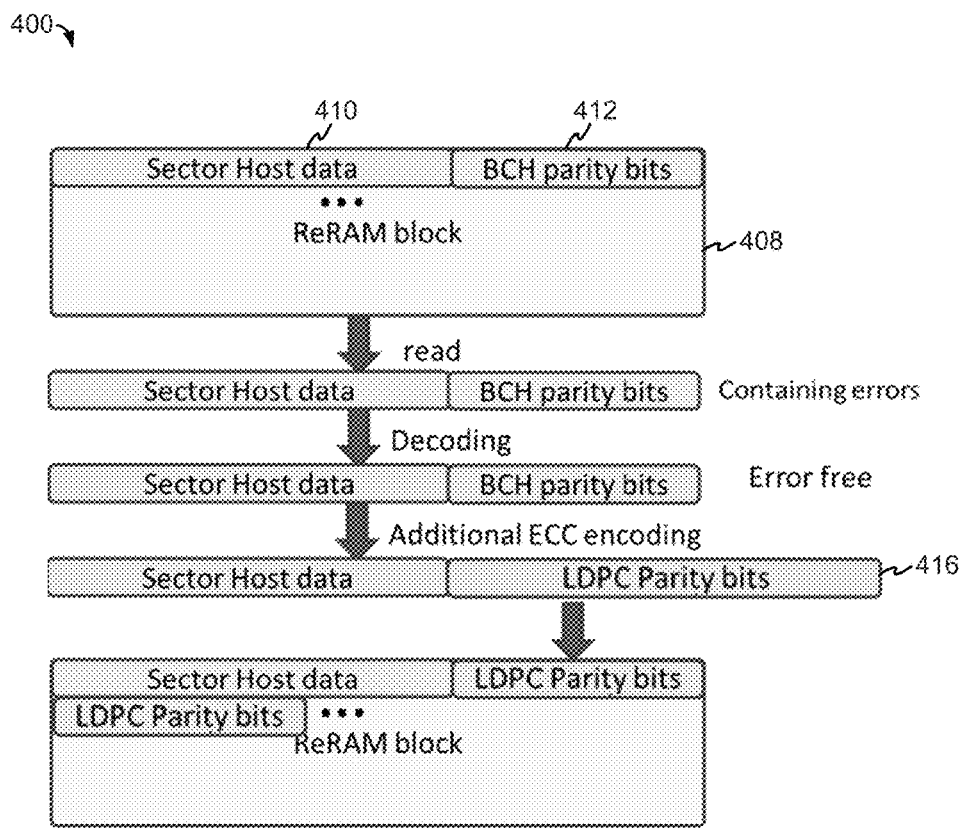
FIG. 4 is a data flow diagram of another example process for adjusting one or more ECC parameters associated with information stored at the data storage device of FIG. 1.

FIG. 4 is a data flow diagram illustrating a process 400 that may be performed at the data storage device 102 of FIG. 1. In the process 400, sector host data 410 and BCH parity bits 412 are included in a ReRAM block 408. The ReRAM block 408 may correspond to a "chunk" or block of information, such as the information 108. For example, the ReRAM block 408 may correspond to a user file, such as an image file, a video file, an audio file, etc. (or a portion thereof). The ReRAM block 408 may include one or more ECC codewords generated by the encoder 132. The sector host data 410 may correspond to the user data portion 110, and the BCH parity bits 412 may correspond to the ECC portion 112.

The controller 120 of FIG. 1 may initiate a read operation to read the sector host data 410. For example, the controller 120 may receive a request for read access to the sector host data 410 from the host device 156, and the controller 120 may initiate the read operation in response to receiving the request for read access.

The controller 120 may input the sector host data 410 and the BCH parity bits 412 to the decoder 134. The decoder 134 may initiate a decoding process to decode the sector host data 410 using the BCH parity bits 412. If an error rate of the sector host data 410 exceeds an error threshold, the decoder 134 may adjust one or more ECC parameters associated with the sector host data 410. For example, the decoder 134 may adjust an ECC scheme used to encode the sector host data 410 and may also decrease a code rate used to encode the sector host data 410. In a particular embodiment, the controller 120 is configured to adjust both the ECC scheme and the code rate in response to an error count indicated by the FBC 144 increasing by at least a threshold amount (e.g., when an error rate associated with information increases by a large amount, which may occur toward the end of the operating life of a device).

The decoder 134 may generate updated ECC information, such as LDPC parity bits 416, based on the sector host data 410. In the example of FIG. 4, the LDPC parity bits 416 are associated with a decreased code rate relative to the BCH parity bits 412 (e.g., the LDPC parity bits 416 may include more bits than the BCH parity bits 412 and may have an increased parity size relative to the BCH parity bits 412). The error rate may be indicated by the FBC 144, the LDPC parity bits 416 may correspond to the updated ECC portion 116, and the one or more ECC parameters may correspond to the one or more ECC parameters 136 of FIG. 1.

After generating the LDPC parity bits 416, the controller 120 may overwrite the BCH parity bits 412 with the LDPC parity bits 416. For example, the controller 120 may send the partial rewrite in-place command 114 to the memory 104 with the LDPC parity bits 416 to cause the memory 104 to overwrite the BCH parity bits 412 with the LDPC parity bits 416. Overwriting the BCH parity bits 412 with the LDPC parity bits 416 may be performed without erasing or rewriting the sector host data 410.

The example of FIG. 4 illustrates that ECC information may be updated and overwritten without erasing or rewriting corresponding user data. For example, the BCH parity bits 412 may be updated with the LDPC parity bits 416 without erasing or rewriting the sector host data 410. Thus, a number of storage elements programmed and erased at the memory 104 may be reduced as compared to reprogramming an entire "chunk" of information (e.g., the ReRAM block 408), thus reducing an overall number of P/E cycles at the memory 104, which may extend an operating life of the memory 104.

FIGS. 2-4 illustrate examples in which ECC information follows user data. For example, in FIG. 4, the BCH parity bits 412 may be written at a position at the end of (i.e., adjacent to a last bit of) the second host data 410, as illustrated. It should be appreciated that a position of ECC information relative to a position of corresponding user data may be different than as illustrated in the examples of FIGS. 2-4. To illustrate, the controller 120 may statistically determine (or "distribute") positions of ECC information relative to user data so that partial rewrite in place commands issued to the memory 104 statistically program storage elements of the memory 104 substantially equally (instead of each partial rewrite in-place command targeting ECC information located at the "end" of user data). In a particular implementation, the ECC distributor 142 of FIG. 1 is configured to distribute locations of ECC information relative to corresponding user data.

To illustrate, the ECC distributor 142 may be configured to statistically distribute locations of ECC portions such that one-third of ECC portions are located before corresponding user data (i.e., at a bit position that precedes a bit position of a first bit of the user data), one-third of ECC portions are located in the middle of (or interspersed with) corresponding user data, and one-third of ECC portions are located at the end of corresponding user data.

In another implementation, the ECC distributor 142 may be configured to statistically distribute locations of ECC portions based on a P/E cycle count indicated by the P/E indicator 146. For example, if a P/E cycle count indicated by the P/E indicator 146 corresponds to a number having a least significant digit of "1" (e.g., 1, 11, 21, 31, 41, etc.) when a write operation is initiated, then the controller 120 may locate an ECC portion within (or approximately within) the first 10 percent of a block of information (e.g., an ECC codeword). As another example, if a P/E cycle count indicated by the P/E indicator 146 corresponds to a number having a least significant digit of "2" (e.g., 2, 12, 22, 32, 42, etc.) when a write operation is initiated, then the controller 120 may locate an ECC portion within (or approximately within) the second 10 percent of a block of information (e.g., an ECC codeword). In this manner, the ECC distributor 142 may statistically distribute ECC portions relative to user data to reduce or prevent partial rewrite in-place commands from statistically targeting certain portions of the memory 104, which could potentially cause uneven wear characteristics at the memory 104.

Figure 5:
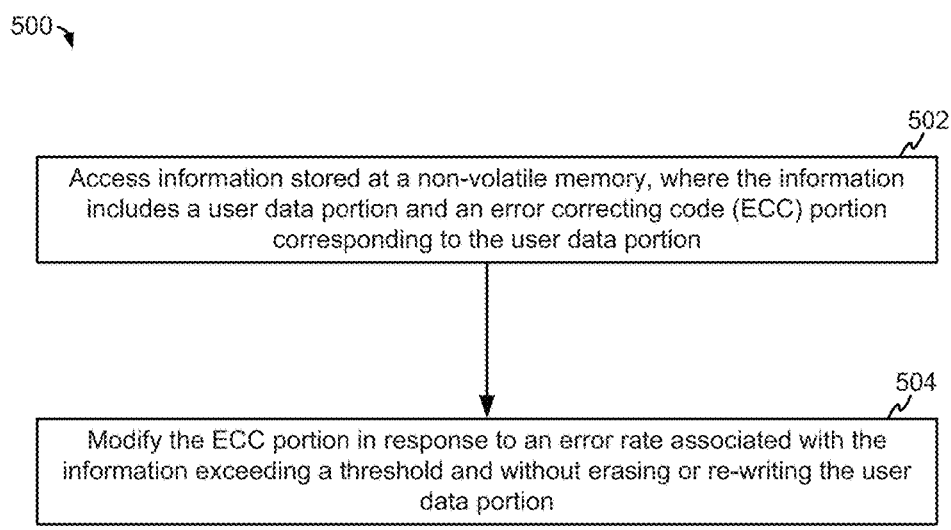
FIG. 5 is a flow diagram that illustrates a particular example method of operation of the data storage device of FIG. 1.

FIG. 5 illustrates an example of a method 500 of operation of a data storage device that includes a non-volatile memory. The data storage device may correspond to the data storage device 102, and the non-volatile memory may correspond to the memory 104. Operations of the method 500 may be performed by the controller 120 and/or by the memory 104.

The method 500 includes accessing information stored at the non-volatile memory, at 502. The information includes a user data portion and an error correcting code (ECC) portion corresponding to the user data portion. The information may correspond to an ECC codeword, and the user data portion and the ECC portion may be included in the ECC codeword. The information may correspond to the information 108, the user data portion may correspond to the user data portion 110, and the ECC portion may correspond to the ECC portion 112. In a particular embodiment, the controller 120 accesses the information 108 in response to receiving a request for read access to the information 108 from the host device 156.

The method 500 further includes modifying the ECC portion in response to an error rate associated with the information exceeding a threshold, at 504. The ECC portion is modified without erasing or re-programming the user data portion. The error rate may be indicated by the FBC 144. In a particular embodiment, modifying the one or more ECC parameters 136 includes overwriting the ECC portion 112 with the updated ECC portion 116 using the partial rewrite in-place command 114 and without erasing or re-programming the user data portion 110.

The method 500 of FIG. 5 may enable a reduced number of P/E cycles at a data storage device. For example, by overwriting ECC information without erasing or re-programming user data, a number of P/E operations is reduced as compared to rewriting (or erasing and rewriting) user data in addition to ECC information.

Figure 6:
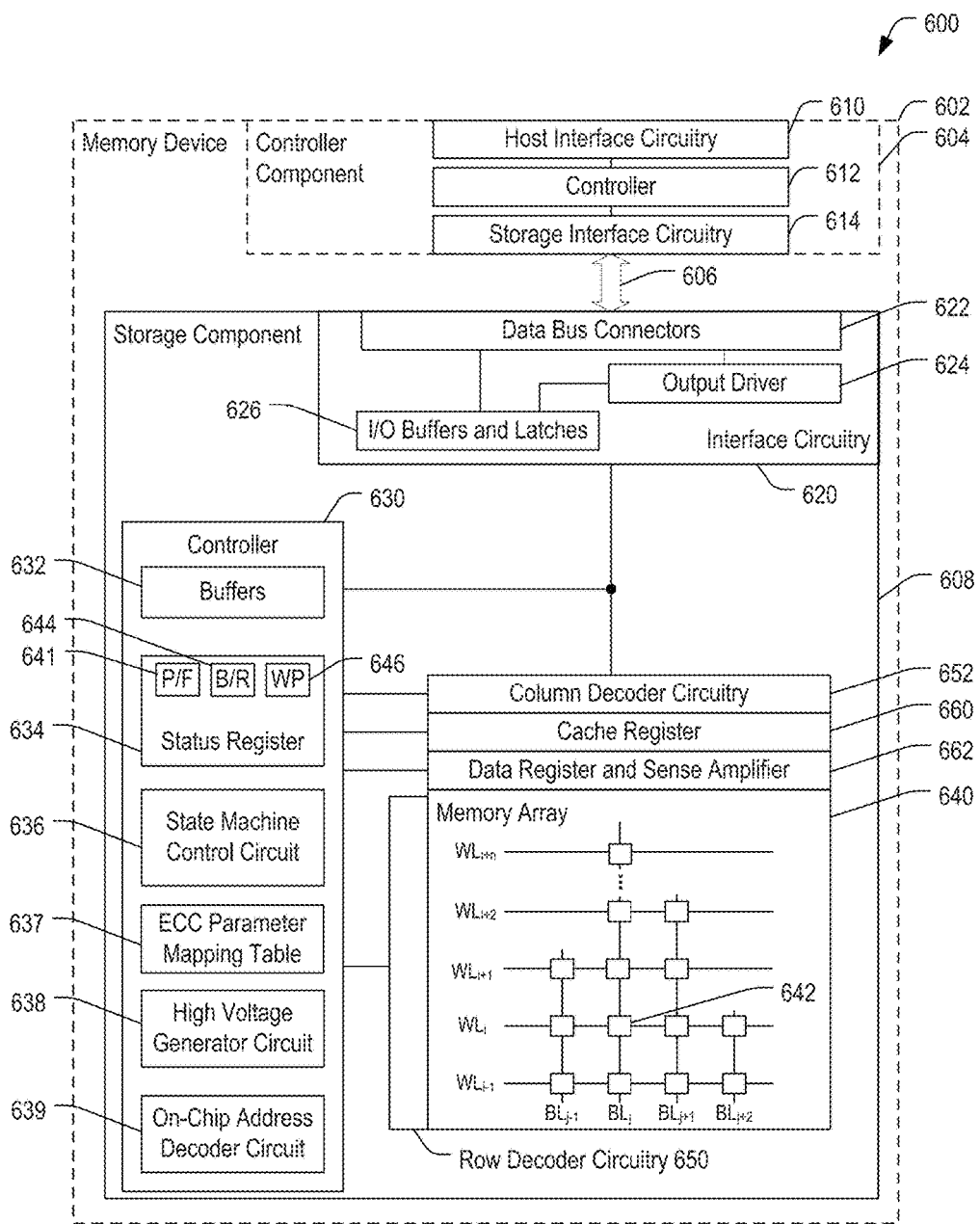
FIG. 6 is a block diagram of a particular embodiment of a system that may be included in the data storage device of FIG. 1.

Referring to FIG. 6, an illustrative embodiment of a system is depicted and generally designated 600. The system 600 includes a memory device 602 that includes a controller component 604 coupled to a storage component 608. In a particular embodiment, the memory device 602 may be the data storage device 102 of FIG. 1.

The controller component 604 may include host interface circuitry 610, a controller 612, and storage interface circuitry 614. The controller component 604 may be coupled to the storage component 608 via a data bus 606, such as an 8-bit or 16-bit parallel data bus, as an illustrative, non-limiting example. The controller component 604 may communicate instructions and data with an external host (not shown) via the host interface circuitry 610. The controller 612 may be configured to respond to instructions received by the host interface circuitry 610 and may also be configured to send and receive data and instructions to the storage component 608 via the storage interface circuitry 614.

In a particular embodiment, the storage component 608 includes interface circuitry 620, a controller 630 coupled to the interface circuitry 620, and a memory array 640 accessible to the controller 630. The storage component 608 may include row decoder circuitry 650 and column decoder circuitry 652 that enable access to data stored at one or more particular rows and particular columns of the memory array 640, such as to read a value from or to write a value to a particular memory cell 642 at a bit line $BL_j$ and at word line $WL_i$. A cache register 660 and a data register and sense amplifier 662 may further be coupled to the memory array 640 and may be used to cache or to temporarily store data that is to be written to the memory array 640 or data that has been read out of the memory array 640. In a particular embodiment, the memory array 640 may include a flash memory.

In a particular embodiment, the controller 630 includes one or more buffers 632 to store instructions, data, or any combination thereof. The controller 630 may also include one or more status registers 634, a state machine control circuit 636, an ECC parameter mapping table 637, a high voltage generator circuit 638, and an on-chip address decoder circuit 639. The ECC parameter mapping table 637 may indicate mappings between blocks of information stored at the memory 104 of FIG. 1 and ECC parameters, such as the particular ECC schemes and/or code rates associated with the blocks of information. For example, the ECC parameter mapping table 637 may indicate whether the information 108 is associated with a BCH scheme or an LDPC scheme and/or a code rate associated with the information 108. It will be appreciated that the ECC parameter mapping table 637 may be updated dynamically by the controller 630 using the techniques described herein.

The controller 630 may be coupled to provide electrical signals to the row decoder circuitry 650, to the column decoder circuitry 652, to the cache register 660, and to the data register and sense amplifier 662. In a particular embodiment, the controller 630, including one or more of the buffers 632, the status register 634, the state machine control circuit 636, the high-voltage generation circuit 638, and the on-chip address decoder circuit 639, in conjunction with the interface circuitry 620 and the memory array 640, may be configured to perform at least a portion of the method 500 of FIG. 5.

In a particular embodiment, the status register 634 of the controller 630 may include one or more indicators storing values, such as a pass/fail (P/F) value 641, a busy/ready (B/R) value 644, a write protect (WP) value 646, one or more other indicators, or a combination thereof. The status register 634 may be accessible to the state machine control circuit 636.

The state machine control circuit 636 may include dedicated hardware and circuitry to control an operation of the controller 630 in response to one or more received instructions and internal states, such as may be represented at the status register 634. The state machine control circuit 636 may include states such as a read status state, a data write state, a data read state, as illustrative, non-limiting examples.

In a particular embodiment, the high voltage generator circuit 638 may be responsive to the state machine control circuit 636 and may be configured to generate a high voltage to program values to, or erase values from, the memory array 640. For example, the memory array 640 may be a flash memory or other memory that may be programmable or erasable via a "high" voltage, such as, for example, five volts (V). The controller 630 may also include the on-chip address decoder circuit 639 that may include hardware and logic circuitry to receive memory address information from the controller component 604 and to decode the memory address information to specific rows and columns to be provided to the row decoder circuitry 650 and the column decoder circuitry 652.

The interface circuitry 620 may include data bus connectors 622, an output driver 624 coupled to the data bus connectors 622, and input/output (I/O) buffers and latches 626. The I/O buffers and latches 626 may be configured to store or to latch data that is received via the data bus connectors 622 or data that is to be written to the data bus 606 via the data bus connectors 622. The data bus connector 622 may include physical electrical connectors that couple the interface circuitry 620 to the data bus 606. The output driver 624 may include dedicated circuitry and electrical connections to enable the interface circuitry 620 to drive electrical signals over the data bus 606. In a particular embodiment, the interface circuitry 620 is configured to comply with one or more bus communications protocols or standards.

Figure 7:
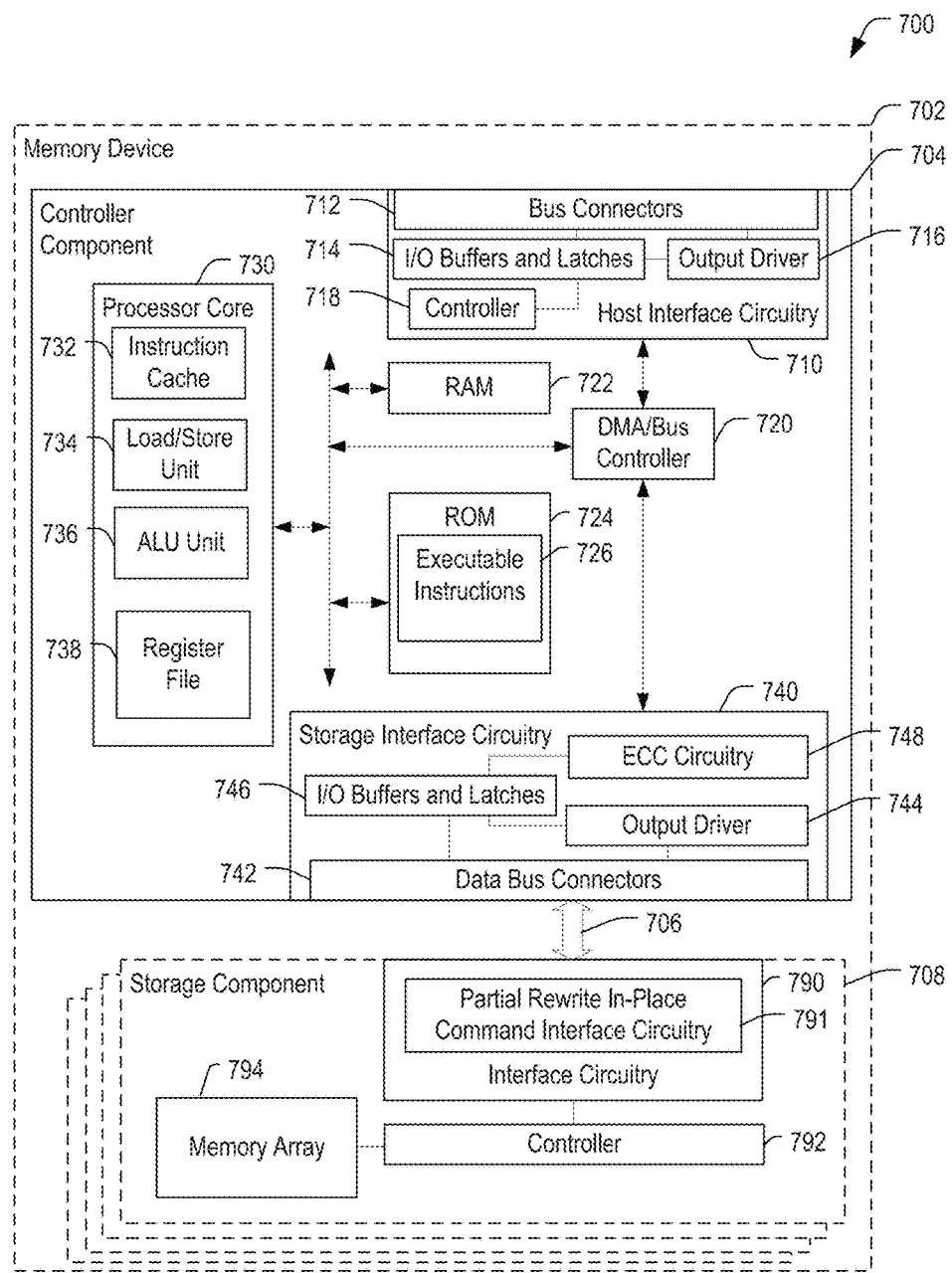
FIG. 7 is a block diagram of another particular embodiment of a system that may be included in the data storage device of FIG. 1.

Referring to FIG. 7, an illustrative embodiment of a system is depicted and generally designated 700. The system 700 includes a memory device 702 that includes a controller component 704 coupled to one or more storage components, such as a representative storage component 708, via a bus 706. The representative storage component 708 includes interface circuitry 790 to communicate via the bus 706. The storage component 708 also includes a controller 792 that is coupled to the interface circuitry 790 and that is also coupled to a memory, such as a memory array 794. The memory array 794 may include one or more types of storage media, such as a 3D NAND array or a ReRAM array. In a particular embodiment, the memory device 702 may be the data storage device 102 of FIG. 1.

The interface circuitry 790 may include partial rewrite in-place command interface circuitry 791 configured to receive the partial rewrite in-place command 114 of FIG. 1. For example, the partial rewrite in-place command interface circuitry 791 may be configured to detect an opcode of the partial rewrite in-place command 114. The partial rewrite in-place command interface circuitry 791 may be configured to provide a control signal to the controller 792 in response to detecting the opcode. The control signal may indicate that a partial write operation is to be performed (e.g., to write ECC information without writing or rewriting user data).

In a particular embodiment, the controller component 704 includes host interface circuitry 710 coupled to a direct memory access (DMA)/bus controller 720. The controller component 704 also includes storage interface circuitry 740 that is coupled to the DMA/bus controller 720. A processor core 730, a random access memory (RAM) 722 and a read-only memory (ROM) 724 are coupled to the DMA/bus controller 720 via an internal bus.

In a particular embodiment, the host interface circuitry 710 includes bus connectors 712 coupled to input/output (I/O) buffers and latches 714. The bus connectors 712 are further coupled to output driver circuitry 716. The host interface circuitry 710 also includes a controller 718. In a particular embodiment, the host interface circuitry 710 operates in accordance with a universal serial bus (USB) protocol. For example, the controller 718 may be programmed to receive USB protocol instructions and data from a host device (not shown) via the bus connectors 712 that are coupled to a universal serial bus. The controller 718 may include a hardware processor that executes instructions stored at an internal memory, such as a read-only memory (not shown) to enable receipt and acknowledgment of USB instructions and data. Alternatively, or in addition, the host interface circuitry 710 may be configured to support other communication protocols, such as a Secure Digital (SD) protocol, a small computer system interface (SCSI), parallel interface (SPI), a Compact Flash (CF) protocol, one or more other protocols, or any combination thereof.

In a particular embodiment, the processor core 730 includes an instruction cache 732, a load/store unit 734, an arithmetic logic unit (ALU) unit 736, and a register file 738. The processor core 730 may include, or may function substantially similarly to, an ARM core, as an illustrative, non-limiting example. For example, the processor core 730 may support a reduced instruction set computer (RISC) micro-architecture. The processor core 730 may be configured to retrieve data and executable instructions 726 via the load/store unit 734 from the ROM 724. The executable instructions 726 may be executable by the processor core 730 to perform one or more operations described herein. For example, the executable instructions 726 may be executable by the processor core 730 to issue the partial rewrite in-place command 114 of FIG. 1 to the memory 104.

Alternatively, or in addition, at least some of the executable instructions 726 may not be stored at the ROM 724 and may be stored at the memory array 794. The executable instructions 726 may be retrieved from the memory array 794 and stored at the RAM 722. The processor core 730 may be configured to retrieve the executable instructions 726 from the RAM 722 for execution.

The executable instructions 726 may be retrieved by the load/store unit 734 and stored to the instruction cache 732. The ALU unit 736 may include dedicated circuitry to perform arithmetic and logic operations, such as addition and subtraction, AND, NOT, OR, exclusive-OR (XOR), other arithmetic or logic operations, or any combination thereof.

The register file 738 may include multiple memory cells that may provide high speed access to the processor core 730 of data to be used for execution of instructions. One or more memory cells at the register file 738 may be dedicated to store a status indicator. Additional data values, such as values to indicate memory type, memory write status, and write protect status, may also be set during execution of the executable instructions 726 at the processor core 730.

The storage interface circuitry 740 may include data bus connectors 742, an output driver 744, input/output buffers and latches 746, and ECC circuitry 748. The data bus connectors 742 may include electrical connectors to enable electrical signal propagation via the bus 706. The I/O buffers and latches 746 may be configured to store data that is received via the DMA/bus controller 720 to be transmitted via the bus 706 using electrical signals at the data bus connectors 742 that are generated by the output driver 744. In addition, or alternatively, the I/O buffers and latches 746 may store data values represented by electrical signals received at the data bus connectors 742 via the bus 706, such as signals generated by the interface circuitry 790 of the storage component 708.

The ECC circuitry 748 may correspond to the ECC engine 122 of FIG. 1 and may include dedicated hardware and circuitry configured to perform operations using data and error correcting code information corresponding to the data that are received as a result of a memory read from the storage component 708, and may perform logical or arithmetic operations to verify that the received data is not detected to have corrupted values. For example, the received data may include additional bits representing an error correcting code, which may be encoded based on values of the data upon storage at the memory array 794. Corruption of one or more bits of the data, or one or more bits of the error correcting code, may be detectable by the ECC circuitry 748. For example, the storage interface circuitry 740 may include a flash memory interface, and the ECC circuitry 748 may be compliant with one or more flash error correcting code protocols.

Figure 8:
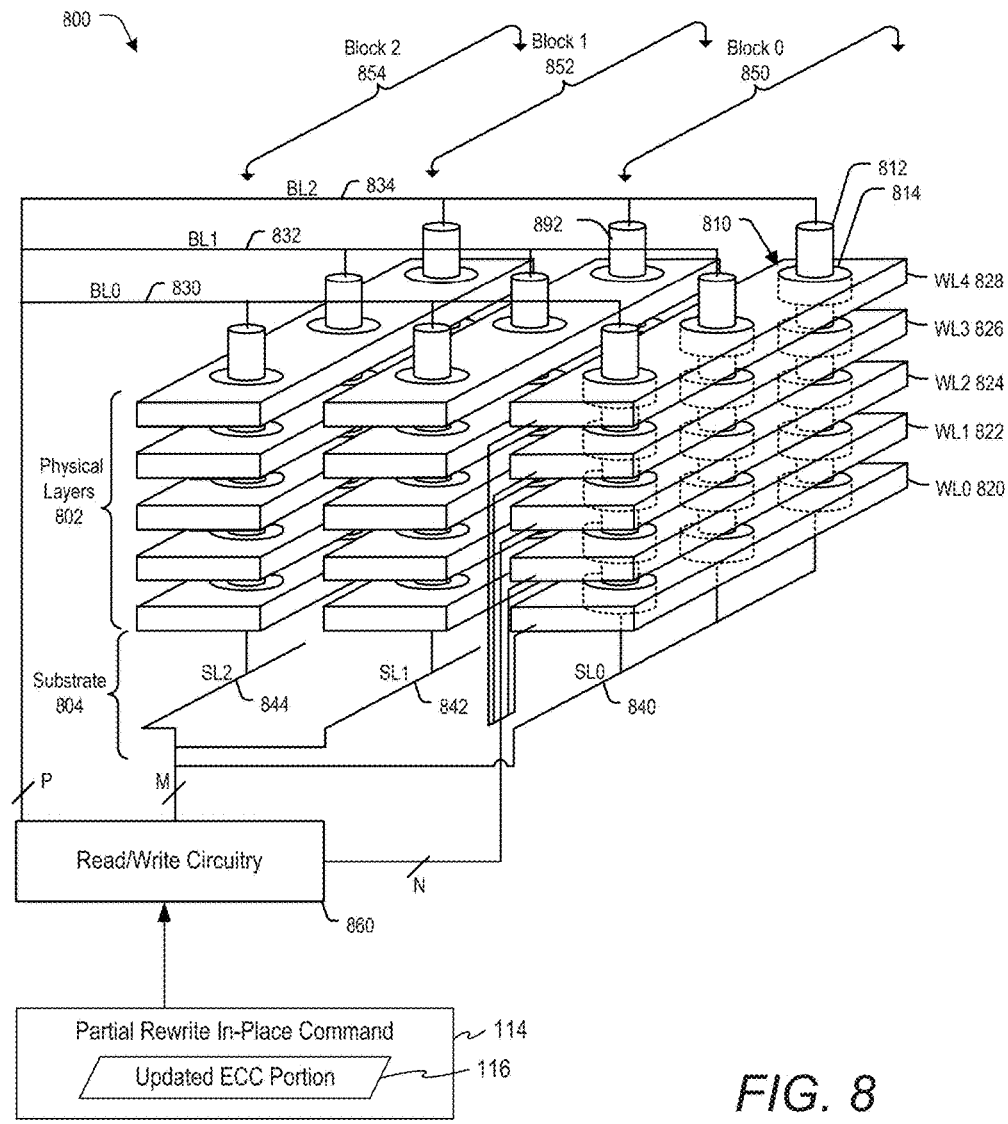
FIG. 8 is a block diagram of a particular embodiment of a memory that may be included in the data storage device of FIG. 1.

FIG. 8 illustrates an embodiment of a 3D memory 800 in a NAND flash configuration. The 3D memory 800 may correspond to the memory 104 of FIG. 1. The 3D memory 800 includes multiple physical layers, such as a group of physical layers 802, that are monolithically formed above a substrate 804, such as a silicon substrate. Storage elements (e.g., memory cells), such as a representative memory cell 810, are arranged in arrays in the physical layers.

The representative memory cell 810 includes a charge trap structure 814 between a wordline/control gate (WL4) 828 and a conductive channel 812. Charge may be injected into or drained from the charge trap structure 814 via biasing of the conductive channel 812 relative to the wordline 828. For example, the charge trap structure 814 may include silicon nitride and may be separated from the wordline 828 and the conductive channel 812 by a gate dielectric, such as silicon oxide. An amount of charge in the charge trap structure 814 affects an amount of current through the conductive channel 812 during a read operation of the memory cell 810 and indicates one or more bit values that are stored in the memory cell 810.

The 3D memory 800 includes multiple erase blocks, including a first block (block 0) 850, a second block (block 1) 852, and a third block (block 2) 854. Each block 850-854 includes a "vertical slice" of the physical layers 802 that includes a stack of wordlines, illustrated as a first wordline (WL0) 820, a second wordline (WL1) 822, a third wordline (WL2) 824, a fourth wordline (WL3) 826, and a fifth wordline (WL4) 828. Multiple conductive channels (having a substantially vertical orientation with respect to FIG. 8) extend through the stack of wordlines. Each conductive channel is coupled to a storage element in each wordline 820-828, forming a NAND string of storage elements. FIG. 8 illustrates three blocks 850-854, five wordlines 820-828 in each block, and three conductive channels in each block for clarity of illustration. However, the 3D memory 800 may have more than three blocks, more than five wordlines per block, and more than three conductive channels per block.

Read/write circuitry 860 is coupled to the conductive channels via multiple conductive lines, illustrated as a first bit line (BL0) 830, a second bit line (BL1) 832, and a third bit line (BL2) 834 at a "top" end of the conducive channels (e.g., farther from the substrate 804) and a first source line (SL0) 840, a second source line (SL1) 842, and a third source line (SL2) 844 at a "bottom" end of the conductive channels (e.g., nearer to or within the substrate 804). The read/write circuitry 860 is illustrated as coupled to the bit lines 830-834 via "P" control lines, coupled to the source lines 840-844 via "M" control lines, and coupled to the wordlines 820-828 via "N" control lines. Each of P, M, and N may have a positive integer value based on the specific configuration of the 3D memory 800. In the illustrative example of FIG. 8, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 892 and a particular source line may be coupled to the top of the conductive channel 812. The bottom of the conductive channel 892 may be coupled (e.g., electrically coupled) to the bottom of the conductive channel 812. Accordingly, the conductive channel 892 and the conductive channel 812 may be coupled in series and may be coupled to the particular bit line and the particular source line.

The read/write circuitry 860 may operate as described with respect to the read/write circuitry 106 of FIG. 1. For example, data may be stored to storage elements coupled to the wordline 828 and the read/write circuitry 860 may read bit values from the storage elements. As another example, the read/write circuitry 860 may apply selection signals to control lines coupled to the wordlines 820-828, the bit lines 830-834, and the source lines 840-842 to cause a programming voltage (e.g., a voltage pulse or series of voltage pulses) to be applied across selected storage element(s) of the selected wordline (e.g., the fourth wordline 828). In an illustrative example, the controller 120 may send the updated ECC portion 116 to the 3D memory 800 via the partial rewrite in-place command 114 to cause the 3D memory 800 to write the updated ECC portion 116 to storage elements of the 3D memory 800.

During a read operation, the controller 120 may receive a request from a host device, such as the host device 156 of FIG. 1. The controller 120 may cause the read/write circuitry 860 to read bits from particular storage elements of the 3D memory 800 by applying appropriate signals to the control lines to cause storage elements of a selected wordline to be sensed. Accordingly, the 3D memory 800 may be configured to read from and write data to one or more storage elements.

Figure 9:
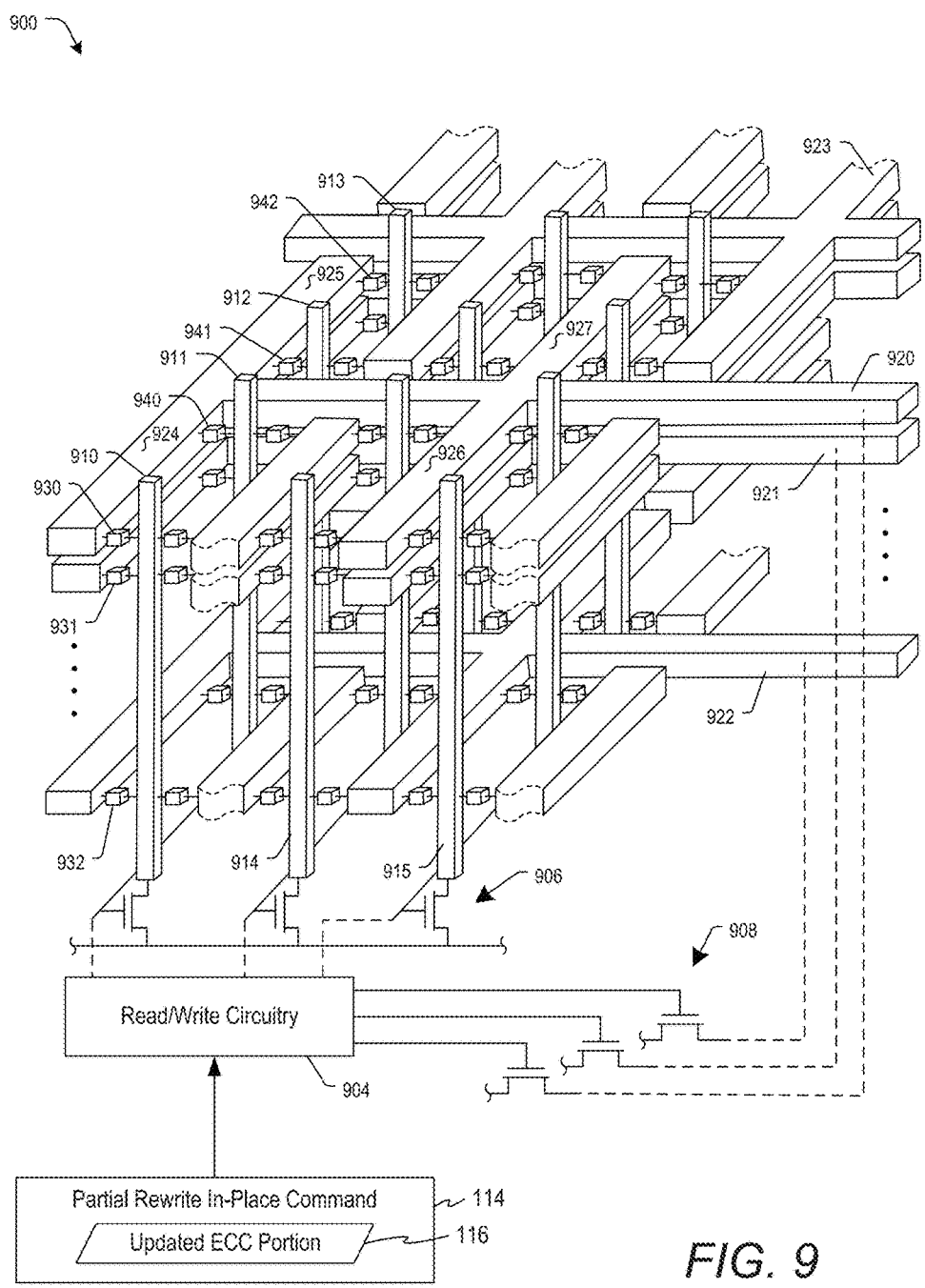
FIG. 9 is a block diagram of another particular embodiment of a memory that may be included in the data storage device of FIG. 1.

FIG. 9 is a diagram of a particular embodiment of a memory 900. The memory 900 may be included in the data storage device 102 of FIG. 1. For example, the memory 900 may correspond to the memory 104. In the embodiment illustrated in FIG. 9, the memory is a vertical bit line ReRAM with a plurality of conductive lines in physical layers over a substrate (e.g., substantially parallel to a surface of the substrate), such as representative wordlines 920, 921, 922, and 923 (only a portion of which is shown in FIG. 9) and a plurality of vertical conductive lines through the physical layers, such as representative bit lines 910, 911, 912, and 913. The wordline 922 may include or correspond to a first group of physical layers, and the wordlines 920, 921 may include or correspond to a second group of physical layers.

The memory 900 also includes a plurality of resistance-based storage elements (e.g., memory cells), such as representative storage elements 930, 931, 932, 940, 941, and 942, each of which is coupled to a bit line and a wordline in arrays of memory cells in multiple physical layers over the substrate (e.g., a silicon substrate). The memory 900 also includes read/write circuitry 904, such as the read/write circuitry 106 of FIG. 1. The read/write circuitry 904 is coupled to wordline drivers 908 and bit line drivers 906.

In the embodiment illustrated in FIG. 9, each of the wordlines includes a plurality of fingers (e.g., a first wordline 920 includes fingers 924, 925, 926, and 927). Each finger may be coupled to more than one bit line. To illustrate, a first finger 924 of the first wordline 920 is coupled to a first bit line 910 via a first storage element 930 at a first end of the first finger 924 and is coupled to a second bit line 911 via a second storage element 940 at a second end of the first finger 924.

In the embodiment illustrated in FIG. 9, each bit line may be coupled to more than one wordline. To illustrate, the first bit line 910 is coupled to the first wordline 920 via the first storage element 930 and is coupled to a third wordline 922 via a third storage element 932.

During a write operation, the controller 120 of FIG. 1 may receive data from a host device, such as the host device 156 of FIG. 1. The controller 120 may send the data (or a representation of the data) to the memory 900. For example, the controller 120 may encode the data prior to sending the encoded data to the memory 900. In an illustrative example, the controller 120 may generate the updated ECC portion 116 and may send the updated ECC portion 116 to the memory 900 via the partial rewrite in-place command 114.

The read/write circuitry 904 may write the data (e.g., the updated ECC portion 116) to storage elements corresponding to the destination of the data. For example, the read/write circuitry 904 may apply selection signals to selection control lines coupled to the wordline drivers 908 and the bit line drivers 906 to cause a write voltage to be applied across a selected storage element. For example, to select the first storage element 930, the read/write circuitry 904 may activate the wordline drivers 908 and the bit line drivers 906 to drive a programming current (also referred to as a write current) through the first storage element 930. To illustrate, a first write current may be used to write a first logical value (e.g., a value corresponding to a high-resistance state) to the first storage element 930, and a second write current may be used to write a second logical value (e.g., a value corresponding to a low-resistance state) to the first storage element 930. The programming current may be applied by generating a programming voltage across the first storage element 930 by applying a first voltage to the first bit line 910 and to wordlines other than the first wordline 920 and applying a second voltage to the first wordline 920. In a particular embodiment, the first voltage is applied to other bit lines (e.g., the bit lines 914, 915) to reduce leakage current in the memory 900.

During a read operation, the controller 120 may receive a request from a host device, such as the host device 156 of FIG. 1. The controller 120 may cause the read/write circuitry 904 to read bits from particular storage elements of the memory 900 by applying selection signals to selection control lines coupled to the wordline drivers 908 and the bit line drivers 906 to cause a read voltage to be applied across a selected storage element. For example, to select the first storage element 930, the read/write circuitry 904 may activate the wordline drivers 908 and the bit line drivers 906 to apply a first voltage (e.g., 0.7 volts (V)) to the first bit line 910 and to wordlines other than the first wordline 920. A lower voltage (e.g., 0 V) may be applied to the first wordline 920. Thus, a read voltage is applied across the first storage element 930, and a read current corresponding to the read voltage may be detected at a sense amplifier of the read/write circuitry 904. The read current corresponds (via Ohm's law) to a resistance state of the first storage element 930, which corresponds to a logical value stored at the first storage element 930. The logical value read from the first storage element 930 and other elements read during the read operation may be provided to the controller 120.

Although the controller 120 and certain other components described herein are illustrated as block components and described in general terms, such components may include one or more microprocessors, state machines, and/or other circuits configured to enable the data storage device 102 (or one or more components thereof) to perform operations described herein. One or more components described herein may be operationally coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. As an illustrative example, the FBC 144 may include a state machine configured to maintain an indication of a number of errors associated with information, such as the information 108. As another example, the P/E indicator 146 may include a state machine configured to maintain an indication of a P/E cycle count associated with the memory 104.

Alternatively or in addition, one or more aspects of the data storage device 102 may be implemented using a microprocessor or microcontroller programmed (e.g., by executing instructions) to perform operations described herein, such as one or more operations of the method 500 of FIG. 5. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM). One or more operations described herein as being performed by the controller 120 may be performed at the memory 104 (e.g., "in-memory" ECC operations, as an illustrative example) alternatively or in addition to performing such operations at the controller 120.

To further illustrate, the controller 120 may include a processor that is configured to execute instructions to perform certain operations described herein. The instructions may include general purpose instructions, and the processor may include a general purpose execution unit operable to execute general purpose instructions. The processor may access the instructions from the memory 104, the RAM 122, another memory location, or a combination thereof. The processor may execute the instructions to access the information 108 stored at the memory 104, such as by executing one or more instructions that cause the controller 120 to issue a read command to the memory 104. The read command may cause the read/write circuitry 106 to sense the information 108 to generate the sensed information 124. The sensed information 124 may be latched into the data latches 107 and may be provided to the controller 120 via a bus or other connection. The processor may execute the instructions modify the ECC portion 112 (e.g., using a write instruction) in response to an error rate associated with the information 108 exceeding a threshold (e.g., by comparing the error rate to the FBC 144 using a compare instruction) and without erasing or re-programming the user data portion 110.

Although examples have been described with reference to a single encoder (the encoder 132) and a single decoder (the decoder 134), it should be appreciated that structures and operations may be implemented using multiple encoders and/or multiple decoders. As an example, the data storage device 102 may include multiple encoders, such as a BCH encoder and an LDPC encoder (e.g., instead of a single encoder that performs BCH encoding and LDPC encoding). Alternatively or in addition, the data storage device 102 may include multiple decoders, such as a BCH decoder and an LDPC decoder (e.g., instead of a single decoder that performs BCH decoding and LDPC decoding). Further, although certain examples have been described with reference to BCH and LDPC techniques for convenience of illustration, it should be appreciated that one or more other ECC techniques can be selected based on the particular application.

The data storage device 102 may be attached to or embedded within one or more host devices, such as within a housing of a host communication device (e.g., the host device 156). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 156.

To further illustrate, the data storage device 102 may be configured to be coupled to the host device 156 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory; and
a controller coupled to the non-volatile memory, the controller configured to:
initiate a read operation to access information of a codeword stored in a word line on a silicon substrate of the non-volatile memory, the codeword comprising a user data portion and an error correcting code (ECC) portion, wherein the controller includes an ECC distributor configured to statistically distribute positions of ECC portions of codewords relative to positions of user data portions;
generate, during a decoding process associated with the read operation, a modified ECC portion corresponding to the user data portion in response to an error rate associated with the information satisfying a threshold; and
write at least one bit of the modified ECC portion to a location at the non-volatile memory, wherein a physical position of the location relative to the user data portion is set to substantially equally program storage elements at the non-volatile memory based on the statistically distributed positions of ECC portions of codewords relative to positions of user data portions.

2. The data storage device of claim 1, wherein the controller is further configured to adjust an ECC scheme used to encode the user data portion, adjust a number of bits used to encode the user data portion, or a combination thereof, and wherein the controller is further configured to generate the modified ECC portion by re-encoding the user data portion in accordance with one or more of the adjusted ECC scheme or the adjusted number of bits and to select the location according to an ECC portion distribution scheme to equally program the storage elements.

3. The data storage device of claim 1, wherein the controller is further configured to initiate the read operation in response to a request for read access, wherein the ECC portion includes Bose-Chaudhuri-Hocquenghem (BCH) information, wherein the modified ECC portion includes low-density parity check (LDPC) information, and wherein writing the modified ECC portion includes overwriting the BCH information with the LDPC information.

4. The data storage device of claim 1, wherein the controller is further configured to generate the modified ECC portion by re-encoding the user data portion in accordance with a decreased code rate as compared to a code rate used to generate the ECC portion.

5. The data storage device of claim 1, wherein the codeword includes a bit of the user data portion adjacent to a bit of the ECC portion, and wherein the controller is further configured to:
write part of the modified ECC portion to a different location than the location of the ECC portion, the different location comprising a different word line or a different erase group.

6. The data storage device of claim 1, wherein the error rate is indicated by a failure bit count (FBC) associated with the information, and wherein the non-volatile memory includes a resistive random access memory (ReRAM).

7. The data storage device of claim 1, wherein the positions of ECC portions of codewords are physical positions.

8. The data storage device of claim 1, wherein the controller is further configured to determine a write position of one or more bits of the modified ECC portion relative to a position of user data of the codeword, the write position determined based on a program/erase (P/E) cycle count.

9. The data storage device of claim 1, wherein the controller is further configured to write the modified ECC portion by sending a partial rewrite in-place command to the non-volatile memory, and wherein the partial rewrite in-place command includes the modified ECC portion and does not include the user data portion.

10. The data storage device of claim 1, wherein the non-volatile memory has a three-dimensional (3D) configuration that is monolithically formed in one or more physical levels of arrays of memory cells having an active area above the silicon substrate, and further comprising circuitry associated with operation of the memory cells.

11. The data storage device of claim 1, wherein the controller is further configured to receive the information from read/write circuitry of the non-volatile memory, wherein the controller includes a decoder configured to perform the decoding process, wherein the error rate is determined based on the decoding process, and wherein the controller is further configured to modify one or more ECC parameters in response to the error rate satisfying the threshold and to encode the user data portion in accordance with the one or more modified ECC parameters to generate the modified ECC portion during the decoding process.

12. An apparatus comprising:
  means for storing data; and
  means for controlling the means for storing data, the means for controlling configured to:
    initiate a read operation to access information of a codeword stored in a word line on a silicon substrate of the means for storing data, the codeword comprising a bit of a user data portion adjacent to another bit of an error correcting code (ECC) portion, wherein the means for controlling includes an ECC distributor configured to statistically distribute positions of ECC portions of codewords relative to positions of user data portions;
    generate, during a decoding process associated with the read operation, a modified ECC portion corresponding to the user data portion in response to an error rate associated with the information satisfying a threshold; and
    write at least one bit of the modified ECC portion to a location at the means for storing data other than a bit location of the ECC portion, wherein a physical position of the location relative to the user data portion is determined, by the means for controlling, so that storage elements of the means for storing data are substantially equally programmed based on the statistically distributed positions of ECC portions of codewords relative to positions of user data portions.

13. The apparatus of claim 12, wherein the means for controlling is further configured to:
  write part of the modified ECC portion to a different location than the ECC portion, the different location comprising a different word line or a different erase group.

14. The apparatus of claim 12, wherein the means for controlling includes means for statistically determining positions in codewords of ECC portions relative to user data portions.

* * * * *